United States Patent [19]

Brandao et al.

[11] Patent Number: 4,809,004
[45] Date of Patent: Feb. 28, 1989

[54] CRYSTAL CONTROLLED MAGNETRON

[75] Inventors: Ruy L. Brandao, Ft. Lauderdale; Henri Baran, Coral Springs; Arezki Manseur, Boca Raton; Steven R. Sweet, Margate, all of Fla.

[73] Assignee: Allied-Signal Inc., Morris Township, N.J.

[21] Appl. No.: 124,203

[22] Filed: Nov. 23, 1987

[51] Int. Cl.$^4$ .......................... H03B 9/10; G01S 7/02; G01S 7/42
[52] U.S. Cl. ................................... 342/199; 342/201; 331/5; 331/47; 331/88
[58] Field of Search ................. 342/199, 200, 201, 26; 331/5, 88, 47

[56] References Cited

U.S. PATENT DOCUMENTS

| 2,820,197 | 1/1958 | Donal, Jr. ........................ 331/88 X |
| 3,290,678 | 12/1966 | Carlsson ............................. 342/199 |
| 3,358,282 | 12/1967 | Wasterlid ........................ 331/47 X |
| 3,555,447 | 1/1971 | Bonfeld et al. . |
| 3,851,271 | 11/1974 | Cooke et al. . |

OTHER PUBLICATIONS

Skolnik, *Radar Handbook*, 1970, McGraw-Hill, pp. 5-15 and 5-39.
L. N. Redinour, *Radar System Engineering*: McGraw-Hill 1947, pp. 632-638.

*Primary Examiner*—Thomas H. Tarcza
*Assistant Examiner*—Gilberto Barrón, Jr.
*Attorney, Agent, or Firm*—Howard G. Massung

[57] ABSTRACT

The invention comprises a weather radar system in which a magnetron transmitter is controlled in frequency by injecting therein a low power locking signal from a stable frequency source. Frequency lock between the source and the magnetron is maintained without requiring injection signals of excessive power by an automatic frequency control (AFC). The AFC determines the frequency and phase error between the injection signal and the magnetron output and adjusts the frequency of the source so as always to be within a narrow band of frequencies centered about the natural frequency of the magnetron. Over the long term, therefore, the frequency of the source will vary by an amount equal to the change in the natural frequency of the magnetron occurring during that time. Over the short term, however, the difference in frequency between the injection signal and the magnetron output is zero, while the phase difference is less than 90°. The frequency source controlling the magnetron also serves as a frequency source for generating the several local oscillator frequencies required by the system receiver. Thus, the pulse to pulse transmitted signals, return signals and receiver i.f. signals all possess a high degree of phase coherence, readily permitting detection and determination of the doppler frequencies contained in the return signals.

19 Claims, 3 Drawing Sheets

CRYSTAL CONTROLLED MAGNETRON

The present invention relates broadly to radar systems. More particularly, it relates to an airborne weather radar system having an injection-locked magnetron transmitter and chain-related heterodyne oscillators for coherent detection of weather phenomena.

The majority of weather radar systems presently in service employ pulse-type transmitters and receivers designed for non-coherent detection of weather return signals. Such systems display the range and bearing of weather phenomena relative to the location of the transmitter, the area affected thereby and the intensity of activity therein, based upon the amplitude of the return signals. Generally, higher amplitude returns are associated with higher precipitation rates. An area displaying a high precipitation rate may be assumed to include highly turbulent winds, but it is known that areas of light precipitation may also involve dangerous turbulence.

The wind velocities within a storm cell are detectable by measurement of the doppler frequencies contained in the radar returns from the cell. The process for detecting such doppler frequencies requires a high degree of pulse to pulse phase coherence in the transmitted signals and in the receiver local oscillator signals. The majority of weather radar systems use pulsed magnetrons for the generation of transmitter signals at microwave frequencies, selected on the basis of cost, power output and reliability considerations. Magnetron transmitters, because of inadequate frequency stability, require exceptionally complicated receivers if the system is to be used for coherent detection of return signals.

Efforts have been made to stabilize the frequency of a magnetron by injecting therein, at the start of oscillation, a low power signal from a highly stable frequency source. Such a frequency stabilized magnetron would enable coherent detection of return signals by a receiver of uncomplicated design. It was found, however, that as the free-running or natural frequency of oscillation of the magnetron drifted away from the frequency of the injected signal, it was necessary to increase the power of the injected signal drastically to maintain the magnetron frequency equal to that of the injected signal. As a consequence, efforts to control the frequency of a magnetron by injection locking to a stable frequency source largely have been abandoned. Instead, transmitters of the oscillator-amplifier type have been favored in weather radar systems capable of turbulence detection.

In an oscillator-amplifier system, the oscillator is designed to operate at a sub-microwave frequency with high frequency stability. One or more frequency multipliers increase the oscillator frequency to the microwave band and the output of the frequency multipliers is amplified in a solid state microwave amplifier for radiation as the transmitter carrier. The oscillator also provides a frequency reference for one or more local oscillators of the receiver, thereby greatly simplifying the design of the receiver for coherent detection of return signals.

The disadvantages of an oscillator-amplifier transmitter, as compared with a magnetron transmitter, include much lower attainable power levels for the transmitter output signal and much higher costs, both in materials and in the labor of assembly and tuning adjustment.

In order to gain the advantages of high power output, high reliability and comparatively low cost of a magnetron transmitter together with the advantage of a relatively uncomplicated receiver design for coherent detection of return signals, it is an object of the present invention to provide a means for stabilizing the frequency of the output signal of a magnetron microwave generator.

It is a further object of the invention to provide a weather radar system in which the transmitter and local oscillators of the receiver are all referenced in frequency to a single, highly stable frequency source.

It is still another object of the invention to provide a magnetron oscillator controlled in frequency by injection locking means capable of maintaining frequency control throughout the normal magnetron frequency band with injection signals of substantially constant, moderate power levels.

Other objects and advantages will become apparent as an understanding of the invention is gained from the following description and accompanying drawings.

BRIEF DESCRIPTION

Briefly, the invention comprises a weather radar system in which a magnetron transmitter is controlled in frequency by injecting therein a low power locking signal from a stable frequency source. Frequency lock between the source and the magnetron is maintained without requiring injection signals of excessive power by an automatic frequency control (AFC). The AFC determines the frequency and phase error between the injection signal and the magnetron output and adjusts the frequency of the source so as always to be within a narrow band of frequencies centered about the natural frequency of the magnetron. Over the long term, therefore, the frequency of the source will vary by an amount equal to the change in the natural frequency of the magnetron occurring during that time. Over the short term, however, the difference in frequency between the injection signal and the magnetron output is zero, while the phase difference is less than 90°. The frequency source controlling the magnetron also serves as a frequency source for generating the several local oscillator frequencies required by the system receiver. Thus, the pulse to pulse transmitted signals, return signals and receiver i.f. signals all possess a high degree of phase coherence, readily permitting detection and determination of the doppler frequencies contained in the return signals.

DETAILED DESCRIPTION

Figures 1, 2:
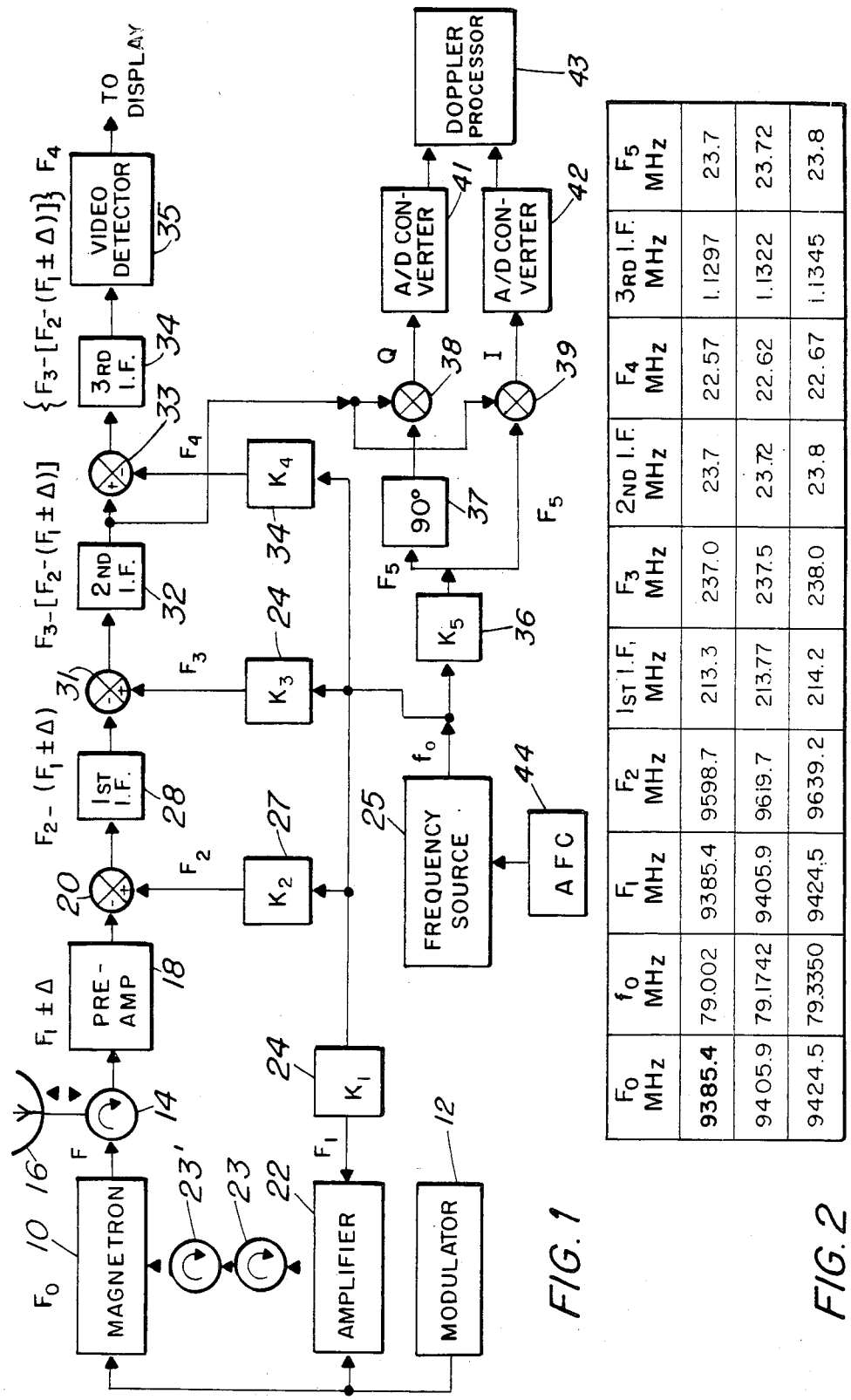
FIG. 1 is a functional block diagram of a radar system incorporating the injection locked magnetron of the invention.
FIG. 2 is a chart showing the frequencies at various points in the system of FIG. 1.

FIG. 1 broadly illustrates the invention. A magnetron 10 is pulse modulated by a modulator 12 to generate microwave energy preferably at X-band frequencies. The output of magnetron 10 is fed through a duplexer 14 to an antenna 16 for radiation. The pulses transmitted by antenna 16 which encounter reflecting targets are returned to the antenna whence the return signals enter duplexer 14 and are passed on to a pre-amplifier 18. Duplexer 14 performs the usual function of allowing pulses from magnetron 10 to pass to antenna 16 but not to pre-amplifier 18 and of allowing return signals from antenna 16 to pass to pre-amplifier 18 but not to magnetron 10. Pre-amplifier 18 amplifies the return signals without converting the frequency of the carrier wave thereof and supplies the amplified return signals to one input of a first mixer 20.

The frequency of the carrier wave generated by magnetron 10 is controlled by a low level microwave signal injected therein from an amplifier 22, the output of which is applied to magnetron 10 through cascaded isolators 23, 23'. Isolators 23, 23' permit signal flow from amplifier 22 to magnetron 10 but block signal flow in the reverse direction, thereby preventing the high level magnetron output signal from entering amplifier 22 and causing damage thereto or pulling the frequency of the output signal thereof.

Amplifier 22 is pulsed "on" simultaneously with the application of an energizing pulse to magnetron 10 by modulator 12. When activated, amplifier 22 amplifies for injection into magnetron 10 an input signal received from a first frequency multiplier 24 which, in turn, receives input from a stable frequency source 25 at frequency $f_o$ and multiplies such frequency by a constant $K_1$ to the microwave frequency $F_1$ at which the frequency of the carrier of the magnetron output is to be controlled.

The return signals at the output of preamplifier 18 have frequencies of $F_1 \pm \Delta$, where $\Delta$ is the doppler variation in the frequency $F_1$ due to relative motion between the antenna 16 and the reflecting targets. The output from preamplifier 18 is mixed with the output of a first local oscillator 27 to generate the input to a first intermediate frequency (i.f.) amplifier 28. First local oscillator 27 is a frequency multiplier which receives input at frequency $f_o$ from source 25 and multiplies the frequency thereof by a constant $K_2$ to produce input to mixer 20 at frequency $F_2 = K_2 f_o$. The first i.f. amplifier is tuned to a center frequency of $F_2 - F_1$ with a band width adequate to cover the band of doppler frequencies $\pm \Delta$ present in the target return signals.

The output of first i.f. amplifier 28 is mixed with the output of a second local oscillator 29 in a second mixer 31. Second local oscillator 29 is a frequency multiplier which receives input at frequency $f_o$ from source 25 and multiplies the frequency thereof by a constant $K_3$ to produce an output signal at frequency $F_3 = K_3 f_o$. The frequency of the output of second mixer 31 is $F_3 - [F_2 - F_1 \pm \Delta)]$. The output of second mixer 31 is amplified by a second i.f. amplifier 32, tuned to the frequency of the mixer output and furnishing one input to a third mixer 33.

Third mixer 33 receives a second input from a third local oscillator 34. Local oscillator 34 is a frequency multiplier producing an output at frequency $F_4 = K_4 f_o$, where $f_o$ is the frequency of the input thereto from source 25. Third mixer 33 generates an output having a frequency $F_3 - [F_2 - (F_1 \pm \Delta)] - F_4$. The output of mixer 33 is amplified in a third i.f. amplifier 34 tuned to the frequency of the mixer output, then detected in a video detector for application to a display indicator (not shown).

Except for the facts that all local oscillator signals are derived from a single frequency source 25, and that the frequency of the magnetron is also controlled by source 25, the invention as thus far described corresponds to a conventional pulse radar with a triple conversion receiver. The control of the magnetron frequency by the source 25 and the derivation of all local oscillator signals therefrom insures pulse to pulse phase coherence in the transmitted and return signals thereby preserving the turbulence information in the doppler content of the return signals.

The doppler content of the return signals is detected by beating the output of second i.f. amplifier 32 against the output of a fourth local oscillator 36. Fourth local oscillator 36 is a frequency multiplier which receives input at frequency $f_o$ from source 25 and multiplies the frequency thereof by a constant $K_5$ to produce an output at frequency $F_5$ equal to the frequency to which second i.f. amplifier is tuned, i.e. $F_5 = F_3 + F_1 - F_2$.

A portion of the output from fourth local oscillator 36 is passed through a 90° phase shifter 37 and applied as one input to a first doppler mixer 38. Another portion of the output of local oscillator 36 is applied, without phase shift, as one input to a second doppler mixer 39. Mixers 38 and 39 each receive second input signals from second i.f. amplifier 32. The output Q of mixer 38 is a spectrum of quadrature components of the doppler content of the return signals stripped of the carrier of the returns. The output I of mixer 39 is a spectrum of the in-phase components of such doppler content, likewise stripped of carrier.

The Q and I outputs of mixers 38, 39 are sampled by separate analog to digital (A/D) converters 41 and 42 controlled by a doppler processor 43 which receives, stores and mathematically processes the digitized samples, utilizing known techniques, to generate display signals indicative of the location and intensity of turbulence of weather phenomena.

Frequency source 25 produces an output $f_o$ which is highly stable in frequency. However, the frequency $f_o$ does not remain constant over the long term. In order to maintain magnetron frequency locked to the frequency $F_1$ of the injection signal from amplifier 22 at relatively low power levels for the amplifier output, the frequency $F_1$ must always be within a very small amount of the free-running frequency $F_o$ the magnetron.

Typically, the free running frequency $F_o$ of a magnetron having a nominal operating frequency of 9345 MHz may vary by $\pm 25$ MHz while the frequency $F_1$ of the injection signal must be within $\pm 2.5$ MHz of $F_o$, i.e. $F_1 = F_o \pm 2.5$ MHz to achieve satisfactory frequency lock.

Frequency source 25 is a frequency synthesizer controlled by an automatic frequency control 44 to produce an output $f_o$ which is variable in steps such that $F_1$ will always be within 2.5 MHz of $F_o$. In one specific embodiment of the invention the following values were selected for the constants $K_1$-$K_5$:

$K_1 = 118.8$
$K_2 = 121.5$
$K_3 = 3.0$
$K_4 = 1/3.5 = 0.2857$
$K_5 = 0.3$

The magnetron of the specific embodiment had a nominal free-running frequency of 9405 MHz with a range of variation of approximately $\pm 20$ MHz.

FIG. 2 is a chart showing the frequencies at various location of FIG. 1 for the specified example.

The variation in the free-running frequency $F_o$ of the magnetron of approximately 40 MHz requires that the frequency source output frequency be variable through a range of 0.333 MHz. It should also be noted that the specified values for the constants $K_1$-$K_4$ yield maximum variations in the frequencies of the first I.F. amplifier 28, second I.F. amplifier 32 and third I.F. amplifier 34 of, respectively, 0.9 MHz, 0.1 MHz and 4.8 KHz. Consequently, adjustment of the tuning of the receiver portion of the system is not required during operation.

Figure 3:
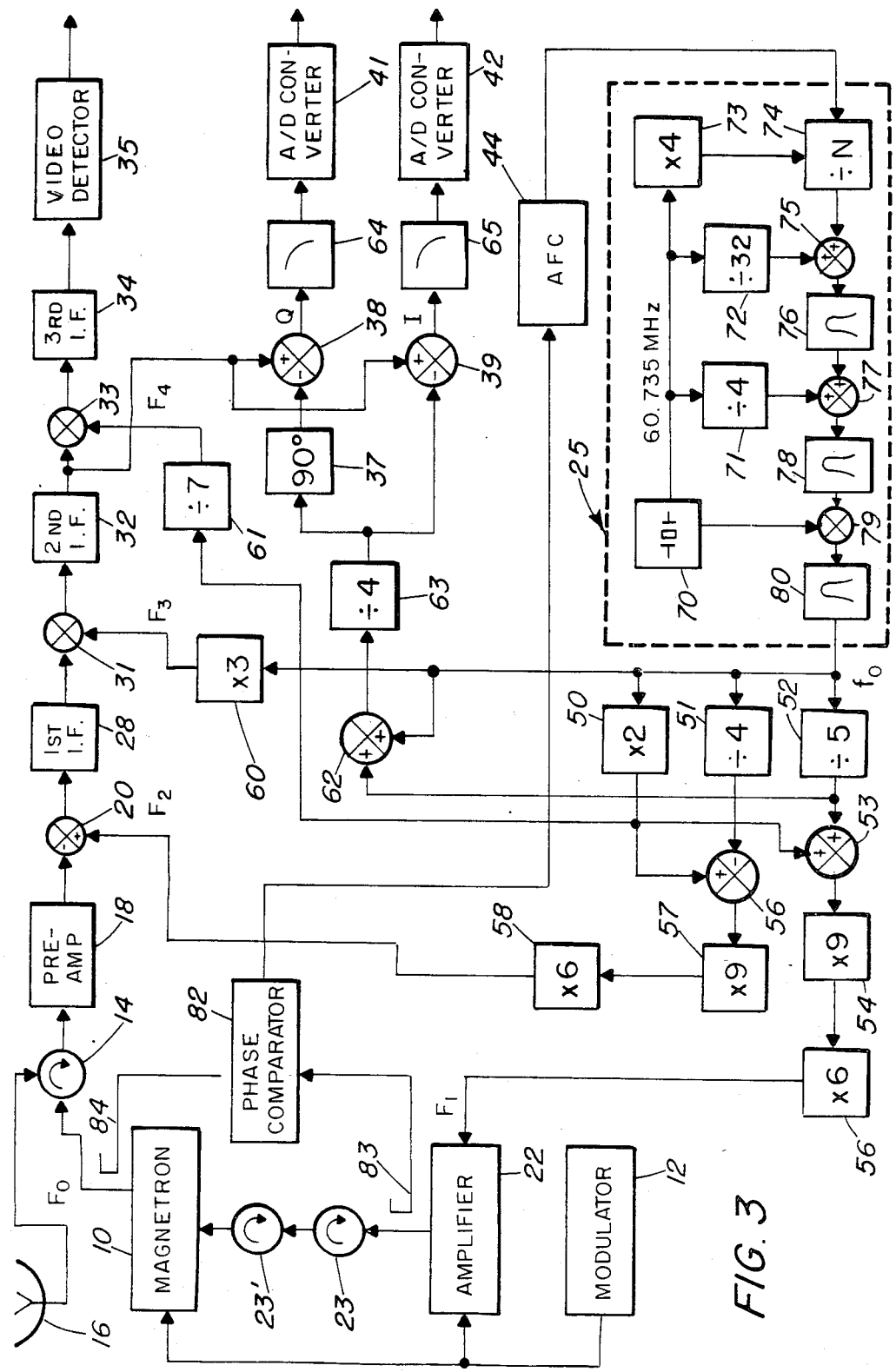
FIG. 3 is a functional block diagram showing the system of FIG. 1 in greater detail.

FIG. 3 is a block diagram showing the system of FIG. 1 in greater detail. Frequency source 25 is a frequency synthesizer producing a signal having a frequency which is variable through the range required of $f_o$, the stability of which is controlled by a crystal oscillator 70. The frequency of the output from oscillator 70 is divided by four in a frequency divider 71, divided by thirty two in a frequency divider 72 and multiplied by four in a frequency multiplier 73.

The multiplied frequency of the output of multiplier 73 is divided by N in a programmable divider 74, the output of which is furnished as one input to a mixer 75. The divisor N of programmable divider 74 is controlled by AFC 44, later described. In the specific embodiment referred to in connection with FIG. 2, N is an integer having a value of from 160 to 205, depending on the frequency $f_o$ required.

Mixer 75 adds the outputs of dividers 72 and 74 to produce an output at the sum frequency of the inputs which is then passed through a bandpass filter 76 to an input of mixer 77. Mixer 77 receives a second input from divider 77 and produces an output at the sum frequency of the inputs. The output of mixer 77 is passed through bandpass filter 78 to an input of mixer 79. Mixer 79 receives a second input from oscillator 70 and produces output at the sum frequency of the inputs. After filtering in bandpass filter 80, the output of mixer 79 appears at the output of synthesizer 25 as the frequency $f_o$.

In the specified embodiment, the frequency of oscillator 70 was selected as 60.735 MHz. Then numerically, the output of divider 74 is selectable between the frequencies of $4\times 60.735/205$ and $4\times 60.735/160$, i.e. from 1.185 to 1.518 MHz.

The output frequency of mixer 75 is 60.735/32 plus from 1.185 to 1.518, which is from 3.083 to 3.416 MHz.

The output frequency from mixer 77 is 60.735/4 plus from 3.083 to 3.416 which is from 18.267 to 18.600 MHz.

Finally, the frequency of the output from mixer 79, and the output frequency $f_o$ of synthesizer 25, is 60.735 plus from 18.267 to 18.600, which is from 79.002 to 79.335 MHz. The band of possible output frequencies from source 25 will be seen to cover the band of $f_o$ frequencies appearing in Column Two of FIG. 2.

Frequencies $F_1$ and $F_2$ involving multiplying factors $K_1$ and $K_2$ are generated as follows.

The output $f_o$ of source 25 is applied to a times-two frequency multiplier 50, a divide-by-four frequency divider 51 and a divide-by-five frequency divider 52. The outputs of multiplier 50 and divider 52 are added together in a mixer 53. The resultant output of mixer 53 is further increased in frequency by a times-nine frequency multiplier 54 and a following times-six frequency multiplier 55, the output of which is a signal at frequency $F_1$. Numerically, $F_1 = f_o[(2+0.2)\times 9\times 6] = 118.8\, f_o = K_1 f_o$.

The outputs of multiplier 50 and divider 51 are added together in a mixer 56. The frequency of the resultant output of mixer 56 is further increased by a times-nine frequency multiplier 57 and a times-six frequency multiplier 58 is cascade therewith to produce an output signal at frequency $F_2$. Numerically, $F_2 = [(2+0.25)\times 9\times 6] = 121.5\, f_o$.

Frequency $F_3$ is straightforwardly produced by a times-three frequency multiplier 60. Frequency $F_4$ is generated by dividing the double frequency output of multiplier 50 in a divide-by-seven frequency divider 61. This permits use of a frequency divider having an integer divisor. Numerically, $F_4 = (2/7)f_o = (1/3.5)f_o = K_4 f_o$.

Frequency $F_5$ has the same value as the frequency of the output of second i.f. amplifier 32, except for the doppler frequency content of the latter.

The second i.f. center frequency is:

$$F_3 - [F_2 - F_1] = F_5 = K_3 f_o - K_2 f_o + K_1 f_o = (3 - 121.5 + 118.8)f_o = 0.3 f_o = K_5 f_o.$$

A mixer 62 adds together output at frequency $f_o$ from source 25 and output from divide-by-five frequency divider 52 to produce output at frequency $1.2 f_o$. The frequency of the output signal from mixer 32 is divided in a divide-by-four frequency divider 63 to yield output at frequency $F_5$. Numerically, $F_5 = 1.2 f_o/4 = 0.3 f_o$.

The outputs of mixers 38 and 39, comprising the Q and I components of the doppler frequency content of the return signals, are passed through low-pass filters 64, 65 prior to conversion to digital form in converters 41, 42.

Figure 4:
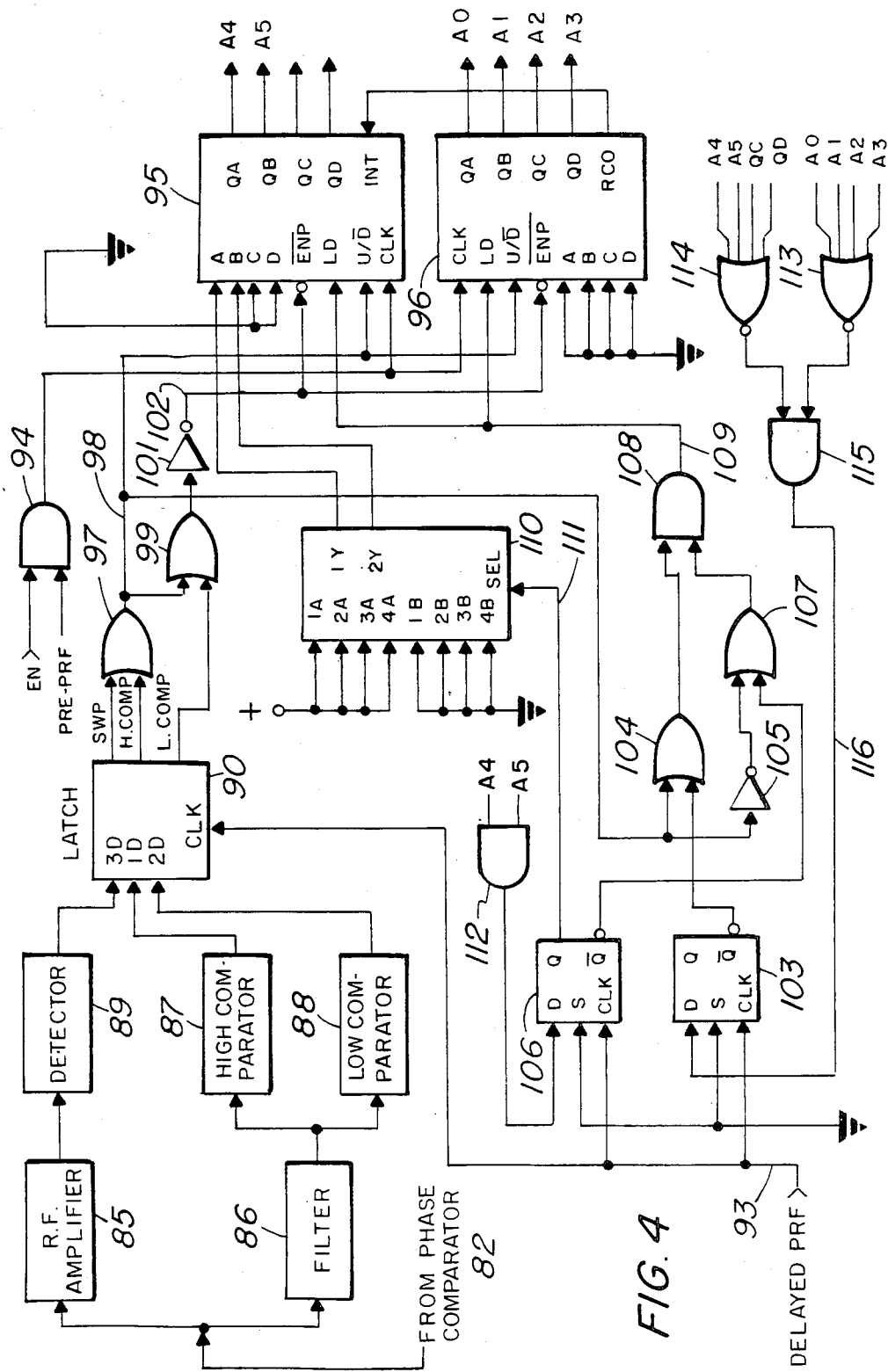
FIG. 4 is a functional block diagram of the automatic frequency control shown in block form in FIGS. 1 and 3.

The automatic frequency control 44 is shown schematically in FIG. 4. Referring first to FIG. 3, a phase comparator 82 receives one input signal at frequency $F_1$ from coupler 83 attached to the output of amplifier 22 and a second input signal at frequency $F_o$ from coupler 84 attached to the output of magnetron 10. When frequencies $F_o$ and $F_1$ differ from one another, the output of phase comparator 82 is an r.f. signal. When frequencies $F_o$ and $F_1$ are equal but differ in phase, the output of phase comparator is a d.c. signal which is positive or negative, depending on whether the phase of $F_1$ lags or leads $F_o$.

Referring now to FIG. 4, the output of phase comparator 82 is applied to an r.f. amplifier 85, which amplifies any a.c. components of the phase comparator output. The output of phase comparator 82 is also applied to a filter 86 which removes any a.c. components from the comparator output and passes the positive or negative d.c. component remaining therein to a high comparator 87 and to a low comparator 88. If the d.c. component of the phase comparator output exceeds a small positive level, high comparator 87 will produce an output; if more negative than a low negative level, low comparator 88 will produce an output. If the d.c. component of the phase comparator 82 lies within the positive and negative thresholds of comparators 87 and 88, neither comparator 87 or 88 will produce an output. The output of amplifier 85, if present, is detected in a detector 89 to produce a positive d.c. output.

The outputs of comparators 87 and 88 and detector 89 are present only for the duration of a transmitter pulse. To preserve these outputs as d.c. levels for the duration of an interpulse period, they are applied to a latch 90. Modulator 12 provides on line 93 a delayed PRF pulse which appears shortly after the beginning of a transmitter pulse and, on line 94, a pre-PRF pulse which appears shortly before the beginning of a transmitter pulse.

AFC 44 operates to produce an output number varying between 0 and 48 which is used to vary the value of the divisor N of programmable divider 74 (FIG. 3) between the values of 160 and 208. An output from high comparator 87 indicates that the frequency or phase of $F_1$ is higher than or leads $F_o$, thus requiring an increase in N to reduce the frequency of $F_1$.

AFC 44 includes two cascaded 4-bit up-down counters which generate a 6-bit output on lines A0–A5 varying between binary 0000 0000 and 0011 0000 (0–48) to control the divisor. Depending upon the states of the control inputs to counters 95 and 96, the output of counters 95 and 96 will remain constant, increment one count or decrement one count during the interpulse period following each transmitter pulse.

If no outputs are present from any of comparators 87, 88 or detector 89, frequency $F_1$ is equal to $F_o$ and the phase difference between the two is sufficiently small that no adjustment of the output of counters 95, 96 is required.

If an output is present only at high comparator 87, frequencies $F_1$ and $F_o$ are equal but the phase of $F_1$ is leading that of $F_o$ excessively indicating a tendency of the natural frequency of the magnetron to drift downward thus requiring a downward adjustment in the locking signal frequency $F_1$.

If an output is present only at low comparator 88, the opposite conditions of $F_1$ and $F_o$ prevail, requiring an upward adjustment in $F_1$.

If outputs are present at detector 89, counters 95 and 96 are caused to sweep count from 0 to 48 or from 48 to 0 until frequency $F_1$ becomes equal to $F_o$ and the phase difference between the two is sufficiently small.

Control of counters 95 and 96 by the outputs of detector 89 and comparators 87, 88 will next be described.

Shortly after the beginning of a transmitter pulse, latch 90 is clocked by a pulse on line 93 and any inputs present on latch inputs 1B–3D are latched into outputs 1Q–3Q. An output from detector 89 is latched on output 3Q (SWP). An output from comparator 87 is latched on output 1Q (H.COMP) and an output from comparator 88 is latched on output 2Q (L.COMP). Outputs SWP and H. COMP are combined in an OR gate 97 to provide on line 98 an SWP+H. COMP logic signal. Signal on line 98 is applied to the U/$\overline{D}$ inputs of counters 95,96. If SWP or H. COMP is high, counters 95, 96 are steered to count up. If neither SWP or H.COMP is high, counters 95, 96 count down. The logic signal on line 98 and L.COMP are combined in OR gate 99 the output of which is inverted by inverter 101 to produce on line 102 a logic signal (SWP+H.COMP+L.COMP)$'=\overline{SWP}.\overline{H.COMP}.\overline{L.COMP}$. Line 102 is connected to the $\overline{ENP}$ inputs of counters 95, 96. If SWP, H.COMP and L.COMP are all low (no output from detector 89, comparator 87 and comparator 88) line 102 is high and neither counter 95, 96 will increment or decrement upon the appearance of a clock pulse. The values of counter outputs A0–A5 remain constant at the values existing. If any one of SWP, H.COMP or L.COMP is high, line 102 is low and counters 95, 96 will increment or decrement when clocked to change outputs A0–A5 up or down.

Counters 95, 96 are preset to 0000 0000(0) or 0011 0000 (48) by the following logic. SWP+H.COMP on line 98 is combined with the inverted $\overline{Q}$ output of a D-type flip-flop 103 in OR gate 104. SWP+H.COMP from line 98 is inverted by inverter 105 to produce an output (SWP+H.COMP)$'=\overline{SWP}\,\overline{H.COMP}$. The output of inverter 105 is combined with the inverted Q output of a flip-flop 106 in OR gate 107 to provide a logic outut $\overline{SWP}.\overline{H.COMP}+\overline{Q}$ 106. (Since the Q output is inverted, that output will be the same state as the Q output).

The outputs of gates 104 and 107 are combined in an AND gate to provide on line 109 [SWP+H.COMP+$\overline{Q}$ 103][$\overline{SWP}.\overline{H.COMP}+\overline{Q}$ 106]. Either SWP or H.COMP must be high and $\overline{Q}$ 106 high; or SWP or H.COMP must both be low and $\overline{Q}$ 103 high to produce a high on line 109. Line 109 is connected to the load control LD of counters 95, 96. If line 109 is high, the outputs A0–A5 of counters 95, 96 are set to the values on the A–D inputs thereof. Inputs A–D of counter 96 are grounded as are inputs C, D of counter 95. Inputs A, B of counter 95 are supplied by outputs 1Y, 2Y of a data selector 110. Data selector 110 is controlled by line 111 to select for outputs 1Y, 2Y the data on inputs 1A, 2A (if line 111 is low) or the data on inputs 1B, 2B (if line 111 is high).

Outputs A4 and A5 of counter 95 are combined in an AND gate 112 to provide A4.A5 as the D input of flip-flop 106. Outputs A0–A3 of counter 96 are combined in a NOR gate 113 to provide (A0+A1+A2+A3)$'=\overline{A0}.\overline{A1}.\overline{A2}.\overline{A3}$. Outputs A4–A5, QC, QD of counter 95 are combined in a NOR gate 114 to provide (A4+A5+QC+QD)$'=\overline{A4}.\overline{A5}.\overline{QC}.\overline{QD}$. The outputs of gates 113 and 114 are combined in AND gate 115 to provide on line 116 [$\overline{A0}.\overline{A1}.\overline{A2}.\overline{A3}$].[$\overline{A4}.\overline{A5}.\overline{QC}.\overline{QD}$]. Thus, all outputs A0–A5, QC, QD of counters 95, 96 must be low for line 116 to be high.

At start up, all outputs of counters 95, 96 are low, line 116 will be high and the output of the inverted $\overline{Q}$ output of flip-flop 103 will be toggled high upon the appearance of a pulse on line 93. SWP and H.COMP are both low, therefore line 109 is high, causing outputs A0–A5 of counters 95, 96 to be set to the values on inputs A–D thereof. Also, at start-up, inputs A4, A5 of gate 112 are both low, providing a low D input to flip-flop 106. A pulse on line 93 sets the Q output of flip-flop 106 low, thereby selecting the high data of inputs 1A, 2A of data selector 110 for outputs 1Y, 2Y thereof. Outputs A0–A5 of counters 95, 96 will accordingly be set to 0011 0000 (48). Divisor N of programmable divider 74 is then set to the highest value, resulting in the lowest frequency output of synthesizer 25 for the next transmitter pulse.

Prior to the next transmitter pulse, SWP, H.COMP and L.COMP are all low, resulting in a high on line 102. Counters 95 and 96 will not then be enabled to changed count when the pre-PRF pulse appears on line 94, prior to the next transmitter pulse.

After the next transmitter pulse, SWP and L.COMP are high and H.COMP is low. Inputs A4 and A5 to gate 112 are high. When the delayed PRF pulse appears on line 93, the Q output of flip-flop 106 is triggered high. Inputs A4 and A5 to gate 114 are high, resulting in a low on line 116, the inverted $\overline{Q}$ output of flip-flop 103 will be triggered low. With Q 103 low and $\overline{Q}$ 106 high, line 109 is high, causing counters to load the data on outputs 1Y, 2Y of data selector 110. Both 1Y and 2Y will then be low because line 106 is high, selecting the B inputs to data selector 110. During subsequent pulse transmissions, with SWP and L.COMP high, line 102 will be low, enabling counters 95, 96 to increment count until such time as SWP, H.COMP and L.COMP all become low.

Outputs A0–A5 of counters 95, 96 do not directly determine the divisor N of programmable divider 74. Instead, they are used as address inputs to a memory device (not shown) in divider 74 which sets the actual value of N. For instance, if A0–A5=0011 0000, N will be set to 208.

The invention claimed is:

1. A microwave generator stabilized in frequency and phase by an injection signal from a stable, variable frequency source, comprising a microwave generator having a natural frequency of oscillation;

an injection signal source having a variable stable frequency output;

means for injecting output from said source into said microwave generator to control phase of said microwave generator;

means providing a control signal output related to the phase difference between the output of said source and the output of said microwave generator, means for comparing the magnitude of said control signal output with a threshold magnitude, said comparing means producing a frequency change signal whenever the magnitude of said control signal output exceeds said threshold magnitude; and means responsive to said frequency change signal for varying the frequency of said injection signal source;

whereby the frequency of said microwave generator is locked to the frequency of said injection signal source and the frequency of said injection signal source is varied to follow changes in the natural frequency of oscillation of said microwave generator.

2. A stabilized frequency microwave generator as claimed in claim 1 wherein said microwave generator is a magnetron.

3. A stabilized frequency microwave generator as claimed in claim 1 wherein said injection signal source includes:

a crystal controlled frequency microwave synthesizer having a variable, stable frequency output.

4. A stabilized frequency microwave generator as claimed in claim 1 wherein said injection signal source includes:

a programmable frequency divider, the divisor N of which determines the frequency of the output of said source.

5. A stabilized frequency microwave generator as claimed in claim 4 wherein said means responsive to said frequency change signal includes:

means for selecting the value of the divisor N of said programmable frequency divider.

6. A stabilized frequency microwave generator as claimed in claim 5 wherein said means for providing a control signal output includes:

a phase comparator having first and second inputs;

means applying signal from said source to said first phase comparator input;

means applying signal from said microwave generator to said second phase comparator input;

said phase comparator producing an output composed of an a.c. component and a d.c. component;

said a.c. component being of a sensible value when the frequencies of said signals applied to said first and second inputs differ from one another and being zero when the frequencies of the signals applied to said first and second inputs are equal;

said d.c. component being of one sense when the phase of the signal applied to said first input leads the phase of the signal applied to said second input and being of the opposite sense when the phase of the signal applied to said first input lags the phase of the signal applied to said input and being zero when the phases of the signals applied to said first and to said second input are substantially in phase, said d.c. component being said control signal applied to said phase comparator;

said phase comparator producing said frequency change signal of a first logic state when the magnitude of said d.c. component of said one sense exceeds said threshold magnitude;

said comparing means producing said frequency change signal of a second logic state when the magnitude of said d.c. component of said opposite sense exceeds said threshold magnitude;

said means for selecting the divisor N of said programmable divider causing said divisor N to be increased numerically whenever said frequency change signal is of said second logic state.

7. A pulse modulated stabilized frequency microwave generator, comprising:

a microwave generator having a natural frequency of oscillation;

an injection signal source having a variable, stable frequency output;

a pulse waveform generator;

means for modulating the output of said microwave generator with the output of said pulse waveform generator;

means for injecting output from said injection signal source into said microwave generator to control the frequency of said microwave generator, the output of said microwave generator differing in phase from the output of said injection signal source whenever the natural frequency of oscillation of said generator differs from the frequency of said injection signal source; and means responsive to a difference between the phases of the output of said microwave generator and the output of said injection signal source for varying the frequency of said injection signal source to maintain said phase difference substantially constant.

8. A pulse modulated stabilized frequency microwave generator as claimed in claim 7 wherein said microwave generator is a magnetron.

9. A microwave generator as claimed in claim 8 wherein said means responsive to a difference between the phases includes:

means for varying the frequency of the output of said injection signal source to cause an increase in the frequency of said source output whenever the phase of the output of said microwave generator leads the phase of said injection source output by an amount greater than a tolerable amount and to cause a decrease in the frequency of said injection source output whenever the phase of the output of said microwave generator lags the phase of said injection source output by an amount greater than said tolerable amount.

10. A microwave generator as claimed in claim 9 wherein said means responsive to a difference between phases includes:

a phase comparator having first and second inputs, signal from said injection source output being applied to said first input thereof, signal from said microwave generator being applied to said second input thereof, said phase comparator producing an output composed of an a.c. component and a d.c. component, said a.c. component being present whenever the frequencies of the signals applied to said first and said second phase comparator inputs differ and being absent whenever the frequencies of said input signals are equal;

said d.c. component being of a first sense whenever the phase of the signal applied to said first input leads the phase of the signal applied to said second input by more than said tolerable amount, said d.c. component being of a second sense, opposite to said first sense, whenever the signal applied to said first input lags the phase of the signal applied to said second input by more than said tolerable amount, wherein said means for varying the frequency includes:

an up/down counter having a first control input for steering said counter to increment or decrement the count thereof according to the state of the signal applied to said first control input, a clock input and a second control input for enabling said counter to increment or decrement the count of said counter upon the appearance of a signal at said clock input according to the state of the signal applied to said first control input;

means providing a clock pulse which is time related to said pulse output of said pulse modulator and for applying said clock pulse to said clock pulse input of said counter;

means providing a first logic signal having a first state whenever said a.c. component of said phase comparator output is present and a second state whenever said a.c. component is absent;

means providing a second logic signal having a first state whenever said d.c. component of said phase detector output is of said first sense and a second state whenever said d.c. component is of said second sense;

means providing a third logic signal having a first state whenever said d.c. component of said phase comparator output is of said second sense and a second state whenever said d.c. component is of said first sense;

first logic means providing an output to said enable input of said counter to enable said counter to increment or decrement count upon the application of a clock pulse thereto, said first logic means combining said first, second and third logic signals to produce said enabling output whenever any one of said first, second and third logic signals is of said first state;

second logic means providing an output to said first control input of said counter to steer said counter to increment or decrement count, said second logic means combining said first and second logic signals to produce an output steering said counter to decrement count whenever said first and second logic signals are both of a second state and steering said counter to increment count whenever either of said first and second logic signals are of a first state; and means for controlling the frequency of said injection signal source in accordance with the count contained by said counter.

11. In a radar system, having a microwave transmitter including a microwave generator having a natural frequency of oscillation; and a microwave receiver of the superheterodyne type, said receiver including:

a local oscillator;

a mixer for combining target return signals from transmitter output signals with output from said local oscillator for generation of an i.f. signal;

a first i.f. amplifier; and means for detecting the output of said first i.f. amplifier;

the improvement comprising:

a source of stable, variable frequency signals;

first means for multiplying the frequency of the signal from said variable frequency source by a first constant to generate a signal at a frequency $F_1$ within the operating frequency range of said microwave generator;

means for injecting said $F_1$ frequency signal into said microwave generator to control the frequency of said microwave generator;

means for comparing the phase of the output of said microwave generator with the phase of said $F_1$ frequency signal to determine the phase difference therebetween, said phase difference bring indicative of a difference between said natural frequency of oscillation of said microwave generator and said $F_1$ frequency;

means for varying the frequency of said variable frequency source in response to said phase difference and thereby to maintain said $F_1$ frequency substantially equal to said natural frequency of said microwave generator; and second means for multiplying the frequency of the signal from said variable frequency signal source by a second constant to generate a signal at a frequency $F_2$, said second means comprising said local oscillator;

said $F_2$ frequency signal being applied to said mixer together with said target return signals, said i.f. signals generated by said mixer having a frequency equal to the difference in frequency between said $F_1$ frequency and said $F_2$ frequency.

12. A radar system as claimed in claim 11 wherein said microwave generator comprises a magnetron.

13. A radar system as claimed in claim 11 wherein the improvement includes, additionally:

third means for multiplying the frequency of the signal from said variable frequency source by a third constant to generate a signal at a frequency $F_3$;

a second mixer, said second mixer receiving the output of said first i.f. amplifier and said $F_3$ frequency signal means to generate a second i.f. signal;

fourth means for multiplying the frequency of the signal from said variable frequency source by a fourth constant to generate a signal at a frequency $F_4$; and a third mixer receiving said second i.f. signal and the output of said fourth multiplying means to generate a third i.f. signal, said third i.f. signal being applied to said detector.

14. A radar system as claimed in claim 11 wherein the improvement includes, additionally:

third means for multiplying the frequency of the signal from said variable frequency source by a third constant to generate a signal at a frequency $F_3$ a second mixer, said second mixer receiving the output of said first i.f. amplifier and said third multiplying means to generate a second i.f. signal;

fifth means for multiplying the frequency of the signal from said variable frequency source by a fifth constant to generate a signal at a frequency $F_5$, said frequency $F_5$ being equal to the difference between said frequency $F_3$ and the difference between said frequency $F_2$ and said frequency $F_1$; and means for detecting signals having a frequency equal to the difference between said $F_5$ frequency and the frequency of said second i.f. signal.

15. A radar system as claimed in claim 14 wherein said last named detecting means includes:

means for detecting components of said signals having frequencies equal to the differences which are in phase with said $F_5$ frequency signal; and means for detecting components of signals having frequencies equal to the differences which are in quadrature phase with said $F_5$ frequency signal.

16. A radar system as claimed in claim 13 wherein the improvement includes, additionally:

fifth means for multiplying the signal from said variable frequency source by a fifth constant to generate a signal at a frequency $F_5$, said frequency $F_5$ being equal to the difference between said frequency $F_3$ and the difference between the difference between said frequency $F_2$ and said frequency $F_1$; and means for detecting signals having a frequency equal to the difference between said $F_5$ frequency and the frequency of said second i.f. signal.

17. A radar system as claimed in claim 16 wherein said last named detecting means includes:

means for detecting components of said signals having a frequency equal to the difference which are in phase with said $F_5$ frequency signal; and means for detecting components of said signal having frequencies equal to the difference which are in quadrature phase with said $F_5$ frequency.

18. A radar system as claimed in claim 13 wherein said microwave generator comprises a magnetron.

19. A radar system as claimed in claim 14 wherein said microwave generator comprises a magnetron.

* * * * *